United States Patent [19]

Myers et al.

[11] Patent Number: 4,680,236
[45] Date of Patent: Jul. 14, 1987

[54] ELECTRODELESS HETEROGENEOUS POLYPYRROLE COMPOSITE

[75] Inventors: Ronald E. Myers, Strongsville; Ephraim Buhks, North Royalton, both of Ohio

[73] Assignee: The BF Goodrich Company, Akron, Ohio

[21] Appl. No.: 830,299

[22] Filed: Feb. 18, 1986

[51] Int. Cl.⁴ .......................... B32B 27/08; H01B 1/06
[52] U.S. Cl. .................................. 428/515; 252/500; 252/518; 252/519
[58] Field of Search ....................... 252/518, 519, 500; 428/515; 526/258

[56] References Cited

U.S. PATENT DOCUMENTS

| | | | |
|---|---|---|---|
| 4,547,270 | 10/1985 | Naarmann | 204/585 |
| 4,566,955 | 1/1986 | Naarmann | 204/59 R |
| 4,567,250 | 1/1986 | Naarmann et al. | 252/518 |
| 4,568,483 | 2/1986 | Naarmann et al. | 252/518 |
| 4,585,581 | 4/1986 | Skotheim | 252/518 |
| 4,585,695 | 4/1986 | Ogasawara et al. | 252/500 |

Primary Examiner—Josephine L. Barr
Attorney, Agent, or Firm—James R. Lindsay; Alfred D. Lobo

[57] ABSTRACT

A conductive composite is formed which consists of a host polymer and polypyrrole ("PP") deposited on and within the host polymer. Instead of using a conductor as a starting substrate, an insulating polymer is at least partially impregnated with sufficient pyrrole (PY) monomer to become conductive after the PY is polymerized. The polymerization is a chemical oxidative polymerization ("dip-polymerization") which, if carried out under anhydrous conditions, transforms the insulating polymer into a semiconductive composite consisting essentially of the host polymer containing a first species of conductive PP and a Group VIII metal halide counterion; thereafter, the semiconductive composite, containing the counterion, is used to electrodeposit on it a second species of conductive PP. The composite with the two species of PP and anions is used for EMI shielding, and in a host of applications where a lightweight organic resistance heating element is desired, for example in de-icers for the wings of an airplane, to melt snow on roof-tops and in gutters, and to warm a frigid seat in a vehicle.

6 Claims, No Drawings

ELECTRODELESS HETEROGENEOUS POLYPYRROLE COMPOSITE

BACKGROUND OF THE INVENTION

The interest in pyrrole polymers derives from their stability and expected affordability compared to other electrically conducting polymers. The fragility and unprocessability of polypyrrole ("PP") films are drawbacks which have prevented the otherwise desirable conductive properties of PP films from being exploited. These drawbacks instigated the concept of combining PP with another polymer ("host") to form a composite which might provide the desirable physical properties of the host polymer and the conductive properties of the PP.

To this general end, the work done to date has been based on the well known facility with which pyrrole (PY) or thiophenes are electrochemically polymerized on conductive electrode surfaces, forming conductive films. The concept was to coat a metal or conductive glass electrode with a thin layer of a polymer which is normally an insulator (conductivity less than about $10^{-6}$ ohm$^{-1}$ cm$^{-1}$ or "S/cm"), then electrochemically deposit (electrodeposit) PP on the coated electrode.

In a specific illustration, a Pt electrode is coated with poly(vinyl chloride) "PVC" film 4-17 microns thick from a 10 g/liter tetrahydrofuran (THF) solution using low molecular weight, unstabilized commercial PVC. The composite film was prepared in a three-electrode, single compartment cell containing 0.0006 M pyrrole in 0.1 M tetraethylammonium fluoroborate-acetonitrile (dry) solution. If the PVC film on the electrode is thin enough, and sufficient voltage is used, PP is grown, first on the surface of the PVC film next to the electrode (inner surface), then, given enough time, through the film and on the surface of the PVC film away from the electrode (outer surface). The acetonitrile solvent was expected to swell the PVC and expose the Pt surface providing the necessary electrical path for formation of the PP containing $BF_4^-$ ions. See "Conductive Composites from Poly(vinylchloride) and Polypyrrole" by DePaoli, M. et al. *J. Chem. Soc., Chem. Commun.*, 1015-16, 1984. This work essentially corroborated the findings set forth in an article titled "Electrochemical Polymerization of Pyrrole on Polymercoated Electrodes" by Osamu Niwa et al. in *J. Chem. Soc., Chem. Commun.*, 817-8, 1984. Niwa et al grew PP on an electrode coated with a 1.2 micron thick PVC film polymerized in acetonitrile solution containing tetraethylammonium perchlorate, so that the PP contained $ClO_4^-$ ions.

That the concentration of the electrolyte was a factor, and that the ions are retained in the PP film deposited was confirmed in an article titled "Conductive Composites prepared by Eletrochemically Polymerizing Pyrrole in Poly(Vinyl Chloride) blended with an Electrolyte" by Wang, T. T. et al *J. Chem. Soc., Chem. Commun.*, 1343-44, 1985.

The only teaching relating to avoiding the direct use of a coated metal electrode on which a PP film can be deposited, is that of the electrochemical deposition of PP onto a polyacetylene anode which is sufficiently conductive to be substituted for a metal electrode. The morphology of the resulting composite depends on the initial doping state of the polyacetylene. Each of the components of the composite is conductive, and so is the composite. See "Composites of Conducting Polymers: PolyacetylenePolypyrrole" by Krische, Bernd et al., *Mol. Cryst. Liq. Cryst.* 121(1-4), 325-8, 1985. Since there is no apparent reason for depositing semiconductive PP on polyacetylene which is acknowledged to be relatively highly conductive compared with known organic polymers and is therefore a conductor, the morphology of the composite containing a single charged species of PP is of little consequence.

By "conductor" we specifically refer to a material which has a conductivity in excess of about 1 S/cm, recognizing that an organic material having a conductivity lower than 1 S/cm is usually deemed to merit a classification as a "semiconductor". Though each of the foregoing references were directed to providing a composite host/PP conductor, none addressed the problem of providing a composite of sufficient thickness which might be of practical use. For example, how is a PVC/PP composite a few microns thick to be used as a practical resistance heating element such as an aircraft de-icer, or a heating element for a seat of a frigid automobile?

It is known that when PP produced by a chemical oxidative polymerization is deposited in the pores of paper, the paper can be made semiconductive. In particular, German (FDR) Offenlegungsschrift DE No. 3321281 Al published Dec. 22, 1983 discloses a chemical process for producing a semiconductive paper by impregnating the paper with different concentrations of an aqueous ferric chloride solution which is acidified with HCl, then exposing the impregnated paper to PY monomer, usually in the gaseous phase. Further details of this process are disclosed in an article titled "Some Properties of Polypyrrole-Paper Composites" by Bjorklund, R.B. et al., *Journal of Electronic Materials*, Vol 13, No. 1, 1984.

Having formed the paper/PP composite they were interested in, it did not occur to them that such a semiconductive composite might possess high enough conductivity to be used as an electrode on which a different species of PP could be electrodeposited. It will be appreciated that chemically oxidatively polymerized PP (formed by oxidation with the halide of a Group VIII metal such as ferric chloride, say) contains $FeCl_4^-$ counterion; electrodeposited PP, on the other hand, contains $HSO_4^-$, or $BF_4^-$, $ClO_4^-$, and the like.

Moreover, though the impregnation of paper with PY monomer was practical because of a choice of paper having adequate porosity, there was no suggestion that either paper or an insulating synthetic resinous material ("host polymer") be swollen by PY monomer ("PY-swelled"), or by PY monomer in solution in a solvent capable of swelling the host polymer ("solvent-swelled"), to provide access for a suitable initiator for the PY which would then be oxidatively polymerized; and, having thus formed a semiconductive composite of host polymer and a chemically deposited ("electroless") species of PP, to use the semiconductive composite in a subsequent electrodeposition process.

It was in this technological framework that it was decided to produce a conductive composite of a normally insulating host polymer having an arbitrary shape such as a sheet, tube or rod, which shape was to be preserved after it was transformed into the conductive composite by depositing on, and in, the polymer a sufficient amount of each of two species of PP to make the composite a conductor. By "conductive composite" we refer to a composite which has a surface resistivity less than 50 ohms/square. For numerous applications, there was, and still is, a need for a "host polymer/PP composite", and particularly a synthetic resinous host/PP composite, which has sufficient stability under ambient conditions to be used as a heating element, or for EMI shielding, inter alia. Our invention fulfills this need.

SUMMARY OF THE INVENTION

A process has been discovered for forming a conductive host organic polymer/PP composite without using a conductor as a starting substrate, but an insulating polymer which is at least partially impregnated with sufficient pyrrole (PY) monomer to become conductive after the PY is polymerized. The polymerization is a chemical oxidative polymerization ("dip-polymerization") which, if carried out under anhydrous conditions, transforms the insulating polymer into a semiconductive composite consisting essentially of host polymer containing a first species of conductive PP and a Group VIII metal halide counterion; thereafter, the semiconductive composite, containing the counterion, is used to electrodeposit on it a second species of conductive PP.

It is therefore a general object of this invention to provide a process for transforming an insulating organic polymer into a conductive composite of a host polymer containing two species of charged PP, the process comprising, (a) contacting a swellable insulating polymer with pyrrole monomer (PY) for a time sufficient to impregnate the polymer with enough monomer to provide a semiconductor when the monomer is chemically oxidatively polymerized; (b) contacting the insulating organic polymer, impregnated with PY monomer, with an anhydrous liquid reaction medium in which a finely divided anhydrous polymerization initiator selected from the group consisting of a halide of a Group VIII metal selected from iron, cobalt and nickel, is dispersed, so as to form a semiconductive composite consisting essentially of the host polymer impregnated with a first species of PP containing a Group VIII metal halide counterion ("host polymer/first species PP" composite); (c) electrodepositing a second species of PP on the semiconductive composite in an amount sufficient to cover the surface of said semiconductive composite and form a conductive composite of the host polymer coated with the second species of PP containing an ion selected from the group consisting of $HSO_4^-$, $BF_4^-$, $AsF_6^-$, p-$CH_3$—Ph—$SO_3^-$, $ClO_4^-$, m—$NO_2$—Ph—$SO_3^-$, $CF_3$—$SO_3^-$, $CH_3(CH_2)_7SO_3^-$ and $PF_6^-$ ("host polymer/first and second species PP" composite).

It is also a general object of this invention to provide a conductive "host polymer/first and second species PP" composite free of any metallic component, which composite is derived from a host polymer more than 0.5 mm thick, and having a surface resistivity less than 50 ohms/square.

It is another general object of this invention to provide a semiconductive "host polymer/first species" PP composite which is subsequently electrodeposited with a metallic component chosen from Groups Ib, IIb, VIb and VIII to form a metal-like composite derived from a host polymer more than 0.5 mm thick, and having a surface resistivity less than 50 ohms/square.

It is a specific object of this invention to provide a non-metallic host polymer/first and second species PP conductive composite in the form of a laminate having a thickness greater than about 0.5 mm which may be used as a resistance heating element.

DETAILED DESCRIPTION OF PREFERRED EMBODIMENTS

The electrically conductive composite of this invention consists essentially of (i) a normally insulating polymer, preferably a synthetic resinous material ("host polymer") and, (ii) poly(2,5-pyrrole), denoted by "PP", distributed heterogeneously within and upon the host polymer as an oxidatively polymerized ("dip-polymerized") PP, and, an electrodeposited PP, each PP species containing different and distinct species of ions. The level of crystallinity of the host polymer, and the extent to which each PP is present in the host polymer, are factors which affect the conductivity and other physical properties of the composite. In particular, the swellability of the host polymer and the amount of PP dip-polymerized to form the semiconductive composite, affect its electrical properties greatly but, quite surprisingly, do not negate its transformation to a conductive composite.

The PP phase, alloyed with the host polymer, is randomly and non-uniformly profusely distributed near the surface and within the matrix of the host polymer, the depth to which the PP is deposited being a function of the PY-swellability and solvent-swellability of the polymer, which in turn determines the permeability of the PY monomer. The more permeable the host polymer and the longer the exposure of the swollen polymer to the PY, the better is the conductivity of the semiconductor composite formed.

The depth to which the host polymer is swollen, measuring from its surface, is not narrowly critical provided the depth is sufficient to have enough PY electrolessly transformed to PP within that depth to provide the requisite semiconductivity. Fortuitously, such a depth is provided in many host polymers by the action of PY monomer itself, without the assistance of a solvent to swell the host polymer.

The dip-polymerized PP may be represented by the structure

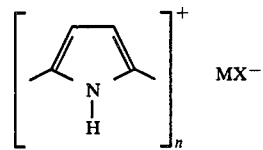

wherein, n is an integer in the range from 2 to about 1000, and more preferably in the range from about 5 to about 20;

M represents a Group VIII metal selected from the group consisting of iron, nickel, and cobalt; and, X represents chlorine, or bromine; so that there is one $MX^-$ anion for each repeating unit consisting of from 3 to about 10 connected pyrrole rings.

Because the host polymer is PY-swellable, or solventswellable, domains of PY are deposited, under anhydrous conditions, simply by contacting the polymer with the PY, or a solution of PY. This is preferably done by simply immersing the polymer in a solution of PP in an inert organic solvent ("solvent" for brevity) in which the PY is substantially soluble. By "substantially soluble" I refer to a solubility of at least 5 parts by wt of PY to 100 parts by wt ("5 pph") of solvent. It is most preferred to use a solvent in which the PY is highly soluble, preferably in an amount greater than 25 pph of solvent. By "inert solvent" we refer to an organic liquid essentially unreactive with the polymerization initiator, or the host polymer, or the PY. By "anhydrous" conditions I refer to an absence of moisture, particularly that the polymerization initiator be essentially free from bound water such as water of hydration.

It will be evident that the electroless polymerization of the pyrrole monomer is carried out in the matrix of the host polymer, and also on its surface. One could reasonably expect that the PY would not be evenly distributed within the polymer, irrespective of the depth to which the PY has penetrated, but even on the surface, the PY is not evenly distributed. This is evident regardless of the solvent used, and whether the solvent is for both the host polymer and the PY.

It is most preferred that the initiator and the PY be soluble in the solvent used, and the host polymer be swellable in it. Plural solvents may be used when a cosolvent for the initiator and the PY does not produce optimum results, provided that the cosolvent swells the host polymer to impart the desired permeability for a sufficient depth to deposit PP without dissolving the host polymer. Where the initiator is used as a dispersion in a solvent in which the initiator is essentially insoluble, the condivity of the composite formed may be too low for subsequent use as an electrode for electrodeposition. To enhance the conductivity obtained, the initiator is preferably used as a finely divided powder having a particle size in the range from about 5 microns to about 45 microns.

It is not essential that the initiator be highly soluble in the solvent, and in most cases, its solubility is limited. By "soluble" initiators I refer to those having a solubility in the range from about 5 to about 25 pph of solvent, a few initiators being more soluble. A solubility of less than 5 pph is generally ineffective for the purpose of providing a desirable semiconductive composite.

Preferred initiators are the halides of iron, cobalt and nickel, preferably the chloride and bromides. Where stable iodides are used, the reactivity is generally not comparable to the chlorides which are more preferred, for example ferric chloride, nickel chloride and cobalt chloride, and the bromides such as ferric bromide, cobalt bromide and nickel bromide, which are less preferred, all in the +3 state. The role of the initiator and other related considerations are set forth in an article titled "Chemical Oxidative Polymerization as a Synthetic Route to Electrically Conducting Polypyrroles" by R. E. Myers, *Jour. Electronic Materials* Mar.'86.

The amount of initiator used and its "freshness" generally controls the speed of the reaction and the molecular weight of the PP formed in the host polymer, the conductivity of which is affected. By "freshness" I refer to initiator which has not been aged, particularly by exposure to the atmosphere.

If the initiator is difficultly soluble in the solvent used, more initiator is generally required than if the initiator is relatively highly soluble. Even when the initiator is soluble, it is preferably used in a major molar amount relative to the monomer, and preferably in the range from above 1 to about 20 moles of initiator per mole of monomer, lesser amounts typically yielding lower than $10^{-3}$ S/cm which is about the limit if the semiconductive composite is to be a usable electrode. All measurements of conductivity made herein are made at 22° C. according to the standard four-probe method. Where the molar ratio of initiator to monomer is in the range from about 0.1 to about 1, and preferably from about 0.25 to 1, the composite formed has too low a conductivity. Where the molar ratio of initiator to monomer is in the range from about 1 to about 20, and more preferably from 1 to about 10, the composite formed is a desirable semiconductive composite.

Liquids in which the initiator is poorly if at all soluble, but in which PY is soluble, and which may have a sufficient swelling effect to provide adequate permeability for a host polymer, include the alkanes such as hexane, and cycloalkanes such as cyclohexane, all having from 4 to about 8 carbon atoms; aromatic liquids such as benzene, toluene and xylene; methoxyxylene, nitroxylene; halogenated aromatic liquids such as chlorobenzene, chlorotoluenes and chloroxylenes; hydrohalomethylenes particularly hydrochloromethylenes; chloroform, perchloroethylene and carbon tetrachloride; sulfolane, 1,4-dioxane and dimethyl sulfone; and, lower primary alcohols having from 1 to about 6 carbon atoms; inter alia. Liquids in which the initiator is soluble include nitromethane and nitrobenzene; essentially unbranched dialkyl ethers having from 4 to about 20 carbon atoms, most preferably diethyl ether; propylene carbonate and N-methyl-2-pyrrolidone, and the like.

The host polymer is preferably any normally electrically non-conducting polymer. Of particular interest for the formation of conductive composites of this invention are copolymers of butadiene with acrylic acid, alkyl acrylates or methacrylates, polyisoprene, polychloroprene, and the like; polyurethanes; vinyl polymers known as PVC resins such as poly(vinyl chloride), copolymers of vinyl chloride with vinylidene chloride, copolymers of vinyl halide with butadiene, styrene, vinyl esters, and the like; polyamides such as those derived from the reaction of hexamethylene diamine with adipic or sebacic acid; epoxy resins such as those obtained from the condensation of epichlorohydrin with bisphenols, and the like; ABS resins, polystyrene, polyacrylonitrile, polymethacrylates, polycarbonates, phenol-formaldehyde resins, polyepoxides, polyesters, and polyolefin homo- and copolymers such as polyethylene, polypropylene, ethylene-propylene polymers, ethylene-propylenediene polymers, ethylene vinyl acetate polymers and the like. Mixtures and blends of polymeric materials such as ABS resin blends, PVC and polymethacrylate blends, elastomer blends of PVC and polyester prepared from short chain aliphatic glycol and diacid monomers such as are disclosed in U.S. Pat. No. 3,574,789, and blends of homopolymers and copolymers such as blends of polypropylene in EPDM polymers, may also be rendered conductive by my electroless polymerization process.

Among the foregoing polymers, those which can be formed into porous sheets, in particular foamed open cell polyurethane, may be made conductive without being swelled, particularly if the pores are relatively small, in the range from about 10 to about 50 microns, since, being porous they are permeable. Upon being made conductive, such sheets may be formed by conventional processes into conductive porous membranes. Thus domains of two species of PP may be formed in porous poly(tetrafluoroethylene) to form a membrane comparable to Gore-Tex ® membrane, except that it is conductive. Open celled polymeric materials having relatively larger pores ("cells"), if swellable by PY monomer, may not require a solvent to swell the filaments forming the cells.

When the semiconductive composite is placed in an electrochemical cell containing a suitable solvent for PY monomer and an appropriate electrolyte which is soluble in the liquid medium used in the electrochemical cell, and unreactive with PY monomer, PP is electrodeposited. Such an electrolyte may be an inorganic or organic salt which furnishes a desirable anion in the PP. An inorganic salt may be lithium or magnesium perchlorate in an unreactive solvent for the salt and also for PY, for example diethylether.

An organic salt is preferably an onium salt, macrocyclic polyether (or crown ether), macrobicyclic polyether (cryptand) and the like which is soluble in propylene carbonate or an alkyl ether. Most preferred is an onium salt of a Group Va element having certain structural limitations. The preferred salts have the formula $R_{n'}, Y^+X^-$ where Y is chosen from N, P and S; R represents either different or identical monovalent organic radicals bonded to Y by covalent linkages; $X^-$ is a counterion; and n' is an integer which may be 3 or 4. When Y is pentavalent, for example P or N, then n'=4, and when Y is tetravalent, for example S, then n'=3. In an analogous manner, onium salts having certain multivalent organic substituents may be useful in this invention. Examples include multivalent organic radicals that include Y in a ring, and those that are bonded to more than one Y.

More preferred onium salts for use in the bath of the electrochemical cell have the formula $(R_aR_bR_cR_dY^+)X^-$ wherein Y is N or P, and $R_a$-$R_d$ are monovalent hydrocarbon radicals preferably selected from the group consisting of alkyl, alkenyl, aryl, alkaryl, aralkyl, and cycloalkyl moieties or radicals, optionally substituted with suitable heteroatom-containing functional groups. The total number of carbon atoms in $R_a$-$R_d$ if the salt is quaternary, should be at least 10 and is preferably in the range from about 15 to 40. No theoretical maximum number of carbon atoms for inclusion in the onium salts exists, although in general about 70 carbon atoms represents the upper limit imposed by practical limitations. The onium salt itself is unreactive with with all materials in the bath.

Most preferred onium salts have Y=N, and the hydrocarbon radicals where $R_a$ is $C_2H_5$, and $R_b$, $R_c$, and $R_d$ are each selected from the group consisting of n-$C_4H_9$; n-$C_5H_{11}$; mixed $C_5H_{11}$; n-$C_6H_{13}$; mixed n-$C_6H_{13}$; $C_6H_5$; $C_6H_5CH_2$; n-$C_8H_{17}$; n-$C_{12}H_{25}$; n-$C_{18}H_{37}$; mixed $C_8$-$C_{10}$ alkyl; and the like. We prefer symmetrical onium salts, namely those in which $R_a$-$R_d$ are each the same.

Various counterions may be used including Cl, Br, I, F, HSO$_4$ and the like, the last being most preferred. A commercially available and highly effective onium salt is tetrabutylammonium hydrogen sulfate ("TBAH").

The semiconductive composite formed is used as an anode in the cell containing PY dissolved in the bath, so that a second species of PP may be deposited on the first species, to form the conductive composite containing a predetermined amount of electrodeposited PP and the X' anion in the structure which may be represented by

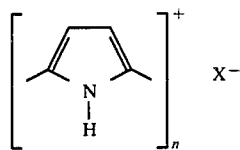

wherein,
n is an integer in the range from 2 to about 1000, and more preferably in the range from about 5 to about 20;
X' represents an ion selected from the group consisting of $HSO_4^-$, $BF_4^-$, $AsF_6^-$, p—$CH_3$—Ph—$SO_3^-$, $ClO_4^-$, m—$NO_2$—Ph—$SO_3^-$, $CF_3$—$SO_3^-$, $CH_3(CH_2)_7SO_3^-$ and $PF_6^-$ so that there is one X' anion for each repeating unit consisting of from 3 to about 10 connected pyrrole rings.

Of great importance is the ease and simplicity with which the conductive composites of this invention may be produced, once the semiconductive composite has been made.

Typically, the host polymer is preferably immersed in an anhydrous solution of PY in a solvent in which the polymer is swellable to a predetermined extent. The precise swelling most desirable for a particular application will be determined with a little trial and error such as one skilled in the art would expect to make. Swelling to a depth of only 1 micron will give a semiconductive composite, but greater depth up to about 0.5 mil is preferred. PY is deposited within and on the polymer which is then immersed in a solution of anhydrous FeCl$_3$ to polymerize the PY. Deposition of PY to greater depths is possible, but there is generally no significant improvement in conductivity with such greater depths and no justifiable economic benefit. A large excess of FeCl$_3$ is preferably used to obtain a conductivity in the range from about $10^{-2}$ to about 1 S/cm. The PY is oxidatively polymerized essentially immediately as can be seen by the black coloration of the semiconductive composite formed.

The conduction process in the PP involves hopping of charge carriers between localized sites associated with the counterion, as explained in an article titled "Charge Transfer in Polypyrrole" by E. Buhks and I. Hodge, *J. Chem. Phys.* 83(11) Dec 1985. The invention is more fully described by the following owing illustrative examples.

EXAMPLE 1

Preparation of Conductive PVC/PP Composite:

A. Preparation of Semiconductive Composite- Unplasticized PVC (Geon®103EP) was pressed into a 0.028 inch thick sheet. A 1"×1.5"×0.028" test strip of PVC was immersed in 10 ml of PY for 18 hr at 22° C. This resulted in a weight gain of 0.0831 g due to PY absorption. The PY impregnated strip was then immersed in 150 ml of diethylether containing 9.8 g of anhydrous FeCl$_3$ for 1 hr at 22°C. The PVC strip is now black in color, indicative of PP formation, and the sample is washed with water, ethanol, and ether, sequentially, then dried. The overall weight increase of the strip is 2.2%, and has increased in thickness by 0.007". The surface resistivity was measured as 180 ohms/square.

B. Preparation of Conductive Composite- The strip prepared as described was then used as the anode in an electrochemical cell containing 1.7 g of tetrabutylammonium hydrogen sulfate (TBAH) dissolved in 50 ml of propylene carbonate containing 1.6 ml of PY. A Pd/Ni strip was used as the cathode. Initial applied voltage was 1.0 V, current reading of $0.623 \times 10^{-3}$ amp. Voltage was increased to 6 V after 2 min and allowed to remain at this level for the 2.5 hr of the electrodeposition process. Final current reading was $23.53 \times 10^{-3}$ amp. The resulting PVC/PP strip was washed with acetonitrile and dried. The electrodeposition process resulted in a weight gain of 0.0964 g; final thickness of the sample was 0.045". Surface resistivity was measured as 20 ohms/square.

Analysis of the strip indicates the presence of both $FeCl_4^-$ and $HSO_4^-$ anions.

EXAMPLE 2

In a manner analogous to that described in Ex. 1 hereinabove a PVC sheet having an initial thickness of 0.075" was used in the same procedure. After electroless deposition of PP, the semiconductive composite had a wt gain of 3.8% and its thickness was 0.078". The surface resistivity of one side was 32 ohms/square and that of the other side was 90 ohms/square.

This composite was used as the anode in the same cell used in the previous example, and after 2.5 hr the thickness of the composite was 0.085". The surface resistivity was 21 ohms/square for one side and 65 ohms/square for the other.

EXAMPLE 3

Criticality of thickness for making a composite by electrodeposition of PP on PVC:

Dissolve 10 g of PVC in 200 ml of THF. Deposit the PVC solution onto a strip of conductive glass (Nesatron) to a thickness of 0.030". Using this PVC coated glass as the the anode in the electrochemical cell described above, and an analogous procedure, there is no evidence of PP formation on the anode after 2.5 hr, whether on the front or rear surface of the PVC layer. The evidence is that a 0.030" thickness of PVC is not permeable enough to permit the electrodeposition of PP under the stated conditions.

EXAMPLE 4

Preparation of Aircraft De-Icer Resisitance Heating Element

A 0.052" thick sample of polycarbonate was exposed to vapors of PY at 22° C. for about 16 hr. The sample was then immersed for 1 hr at 22° in 300 ml of diethylether containing 19.6 g of anhydrous $FeCl_3$. The initially colorless, transparent sample changed to a black color indicative of PP formation. The PP-impregnated polycarbonate sample was then treated for 2.5 hr in an electrochemical cell containing 3.4 g TBAH, 3.2 ml PY and 100 ml propylene carbonate (6V applied, $30 \times 10^{-3}$ amps). After rinsing the treated sample with acetonitrile, the polycarbonate/PP composite was overlaid on the upper outer surface of a simulated aircraft wing and the entire assembly was then placed in a cold chamber. Plural samples in the form of strips were connected in parallel and in series to serve as resistance heating elements. The composite-covered wing was connected to a constant power source in a conventional manner and the temperature of the composite was measured with an Analogic AN2572 temperature probe. The following data were collected:

| Time min | Wing Temp °C. | Voltage (volts) | Current (amps) |
| --- | --- | --- | --- |
| start | −22 | — | — |
| 13 | −4.7 | 4 | 1.0 |
| 17 | 5.5 | 4.7 | 1.2 |
| 21 | 6.8 | 5.0 | 1.4 |
| 26 | 16.4 | 5.5 | 1.6 |
| 33 | 29.3 | 5.9 | 1.8 |

When the wing temperature reached 43° C. the experiment was terminated.

EXAMPLE 5

In a manner analogous to that described in Example 4 hereinabove, a strip 1 mm thick, of polyphenylene oxide (Noryl ®) was impregnated with PP by first soaking in methylene chloride then exposing the strip to PY vapor for about 1 hr. The strip was then placed in an electrochemical cell and PP deposited on and within the strip, the deposit of PP extending to a depth corresponding to that to which the strip was swelled by the methylene chloride, namely from about 1 to about 10 mils. The strip coated with both oxidatively polymerized and electrochemically polymerized PP, and having two different anions associated with the PP, is washed and dried. A multiplicity of such strips connected in parallel/series are used as resistance heating elements on a seat of a chair, more especially that of a vehicle, to warm it. Plural strips connected in series may be used to warm conduits, or to melt snow on roof-tops and in gutters; and conductive PVC pipe is used to heat process fluids flowing therethrough.

EXAMPLE 6

Preparation of a conductive composite of foamed open cell polyurethane coated with chemically oxidatively polymerized PP, subsequently coated with an electrodeposited metal A porous metal body, termed a "reticulate", having an open pore metal or metal-like structure of arbitrary size in which a multiplicity of voids, whether cells, pores and/or passages are in open fluid communication with each other, is formed as follows: An open cell foamed polymeric 4,4-diphenylmethane diisocyanate parallelepiped ('slab') about $6'' \times 6'' \times 0.5''$ thick, having relatively large pores (about 0.125" equiv. diam.) bounded by filaments having a thickness in the range from about 0.2-5 mils is soaked in methylene chloride to swell the filaments, then dip-polymerized to provide a coating of PP on the filaments, as described hereinabove, washed and dried. The slab is then placed in an electrochemical cell and copper is electrodeposited on the PP-coated filaments from a dilute solution of copper sulfate, forming a copper reticulate. In an analogous manner, platinum may be deposited from a chloroplatinic acid bath. Thus numerous reticulates may be produced for a variety of different purposes as described for example, in U.S. Pat. Nos. 3,549,505; 3,679,552; 4,515,672; inter alia and the references cited therein.

It will be recognized that composites formed as described in this Ex. 6 have a single species of PP and Group VIII metal halide anion associated with it, and the subsequent electrodeposition of metal is on the conductive host polymer/PP composite so formed.

Composites of organic polymers upon which PP has been first dip-polymerized, then electrodeposited with a metal, using the dip-polymerized composite as the electrode, to form a reticulate or other conductive body of arbitrary shape, have excellent temperature stability because the adhesion of metal to PP, and that of non-electrochemically (electrolessly) deposited PP to the host polymer is surprisingly good. More remarkable is that the metal-free composites of host polymer and two species of PP is also highly temperature-stable, as is evident from the results obtained with the following temperature cycling test procedure for each of various composite strips: 1. Each strip is subjected to a temperature held within the range from −40° C. to −50° C. for 30 minutes, left at room temperature (about 25° C.) for 5 min, then held at 70° C. in air for 30 min. 2. The above cycle is repeated 10 times for each sample.

The effect of the foregoing temperature cycling on each strip of several polymeric materials is given below:

| Host Polymer | Surface Resistivity, ohms/square | |
|---|---|---|
| | Original, Avg. | After temp. cycling |
| ABS, 0.085" thk | 132 | 51 |
| Lexan, 0.090" | 71 | 38 |
| Noryl, 0.077" | 35 | 34 |
| PVC, 0.065" | 205 | 125 |
| Estane ® 58202*, 0.083 | 78 | 67 |

*thermoplastic polyurethane from The B. F. Goodrich Company

The foregoing samples experienced less than 0.5% wt loss during the testing procedure.

Each of the composite strips, after being subjected to the temperature cycling tests, was tested for adhesion of the electrodeposited PP to the host polymer/electrolessly deposited PP composite, using ASTM D3359-78 tape test using Scotch #610 brand tape. The tests are qualitatively rated below:

| Host Polymer | Adhesion |
|---|---|
| ABS | good |
| Lexan | fair-good |
| Noryl | good |
| PVC | good |
| Estane | good |

We claim:

1. A conductive composite consisting essentially of
(i) a normally insulating host polymer having an arbitrary shape and sufficient thickness to have heterogeneously deposited, on and within said polymer, for a depth of at least 1 micron,
(ii) a first poly(2,5-pyrrole) ("PP") species in combination with a counterion of a Group VIII metal halide represented by the structure

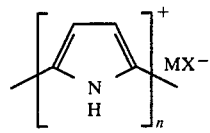

wherein,
n is an integer in the range from 2 to about 1000;
M represents a Group VIII metal selected from the group consisting of iron, nickel, and cobalt; and,
X represents chlorine, or bromine; so that there is one MX⁻ anion for each repeating unit consisting of from 3 to about 10 connected pyrrole rings, said combination of first species of PP and counterion being present in an amount sufficient to form a semiconductive composite; and,
(iii) a conductive species electrodeposited on said semiconductive composite in an amount sufficient to increase the conductivity of said semiconductive composite.

2. The conductive composite of claim 1 wherein said host polymer has a surface resistivity less than 50 ohms/square, and said semiconductive composite has a conductivity in the range from about $10^{-3}$ S/cm to 1 S/cm; and said conductive composite has a conductivity greater than 1 S/cm.

3. The conductive composite of claim 2 wherein said host polymer is more than about 0.5 mm thick and said conductive species is a second PP species in combination with a counterion which combination may be represented by the structure

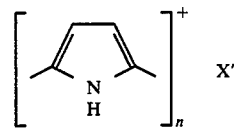

wherein,
n is an integer in the range from 2 to about 1000;
X' represents an ion selected from the group consisting of $HSO_4^-$, $BF_4^-$, $AsF_6^-$, p—$CH_3$—Ph—$SO_3^-$, $ClO_4^-$, m—$NO_2$—Ph $SO_3^-$, $CF_3$—$SO_3^-$, $CH_3(CH_2)_7SO_3^-$ and $PF_6^-$; Ph represents phenyl;
so that there is one X' anion for each repeating unit consisting of from 3 to about 10 connected pyrrole rings, said combination of second PP species and counterion X' being present in an amount sufficient to increase the conductivity of said semiconductive composite.

4. The conductive composite of claim 2 wherein M is a metal selected from Groups Ib, IIb, VIb, and VIII of the Periodic Table.

5. The conductive composite of claim 3 wherein said normally insulating host polymer is a synthetic resinous material which is swellable by contact with pyrrole monomer.

6. The conductive composite of claim 3 wherein said normally insulating host polymer is a synthetic resinous material which is swellable by an organic solvent other than pyrrole, and said solvent is unreactive with pyrrole.

* * * * *